United States Patent
Wang et al.

(10) Patent No.: US 10,249,530 B2
(45) Date of Patent: Apr. 2, 2019

(54) INTERLAYER DIELECTRIC FILM IN SEMICONDUCTOR DEVICES

(71) Applicant: Taiwan Semiconductor Manufacturing Co., Ltd., Hsinchu (TW)

(72) Inventors: Tsan-Chun Wang, Hsinchu (TW); De-Wei Yu, Ping-Tung (TW); Ziwei Fang, Hsinchu (TW); Yi-Fan Chen, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/473,166

(22) Filed: Mar. 29, 2017

(65) Prior Publication Data

US 2017/0207117 A1 Jul. 20, 2017

Related U.S. Application Data

(62) Division of application No. 14/882,865, filed on Oct. 14, 2015, now Pat. No. 9,634,141.

(51) Int. Cl.
*H01L 29/78* (2006.01)
*H01L 21/768* (2006.01)
(Continued)

(52) U.S. Cl.
CPC .. *H01L 21/76825* (2013.01); *H01L 21/02321* (2013.01); *H01L 21/02337* (2013.01); *H01L 21/265* (2013.01); *H01L 21/3105* (2013.01); *H01L 21/31051* (2013.01); *H01L 21/31111* (2013.01); *H01L 21/31155* (2013.01); *H01L 21/324* (2013.01); *H01L 21/76802* (2013.01); *H01L 21/76819* (2013.01); *H01L 21/76828* (2013.01); *H01L 21/76895* (2013.01); *H01L 21/823431* (2013.01); *H01L 21/823475* (2013.01); *H01L 23/481* (2013.01);
(Continued)

(58) Field of Classification Search
CPC .......... H01L 27/0886; H01L 29/41791; H01L 29/66795; H01L 29/668; H01L 29/66818; H01L 29/7831; H01L 29/785; H01L 29/7856; H01L 29/786; H01L 29/791
See application file for complete search history.

(56) References Cited

U.S. PATENT DOCUMENTS 5,124,271 A * 6/1992 Havemann ........ H01L 29/66272
148/DIG. 9
9,153,693 B2 10/2015 Yu et al.
(Continued)

*Primary Examiner* — Cuong Q Nguyen
(74) *Attorney, Agent, or Firm* — Sterne, Kessler, Goldstein & Fox, PLLC

(57) ABSTRACT

A method of forming a semiconductor device includes depositing a flowable dielectric layer on a substrate and annealing the flowable dielectric layer. The method further includes performing a high temperature (HT) doping process on the flowable dielectric layer. The HT doping process may include implanting dopant ions into the flowable dielectric layer and heating the substrate during the implanting of the dopant ions. The heating of the substrate may include heating a substrate holder upon which the substrate is disposed and maintaining the substrate at a temperature above 100° C. An example benefit reduced the wet etch rate (WER) of the flowable dielectric layer.

20 Claims, 8 Drawing Sheets

(51) Int. Cl.
  *H01L 21/265*    (2006.01)
  *H01L 21/3105*   (2006.01)
  *H01L 21/324*    (2006.01)
  *H01L 29/66*     (2006.01)
  *H01L 21/311*    (2006.01)
  *H01L 21/3115*   (2006.01)
  *H01L 21/8234*   (2006.01)
  *H01L 23/522*    (2006.01)
  *H01L 27/088*    (2006.01)
  *H01L 29/417*    (2006.01)
  *H01L 21/02*     (2006.01)
  *H01L 23/48*     (2006.01)

(52) U.S. Cl.
  CPC ...... *H01L 23/5226* (2013.01); *H01L 27/0886* (2013.01); *H01L 29/41791* (2013.01); *H01L 29/66795* (2013.01); *H01L 29/7848* (2013.01); *H01L 29/7851* (2013.01)

(56) References Cited

U.S. PATENT DOCUMENTS

| | | |
|---|---|---|
| 9,269,786 B2 | 2/2016 | Chou et al. |
| 2013/0069164 A1* | 3/2013 | Marino ............... H01L 27/0886 257/369 |
| 2014/0027816 A1* | 1/2014 | Cea ....................... H01L 29/785 257/192 |
| 2015/0097291 A1* | 4/2015 | Huisinga ............. H01L 23/5226 257/751 |
| 2015/0279974 A1* | 10/2015 | Godet ............... H01L 29/66803 438/283 |

* cited by examiner

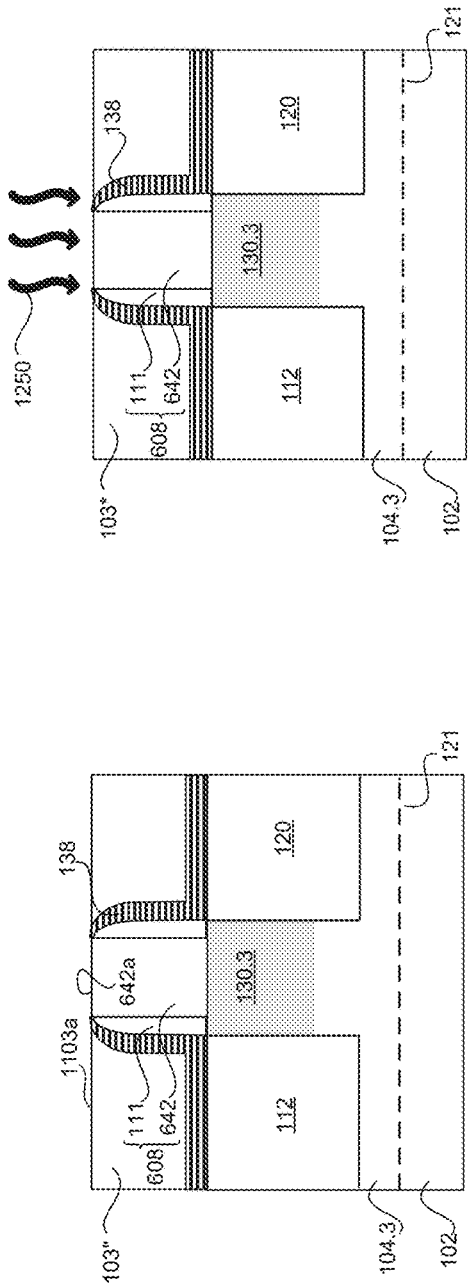
FIG. 11
FIG. 12
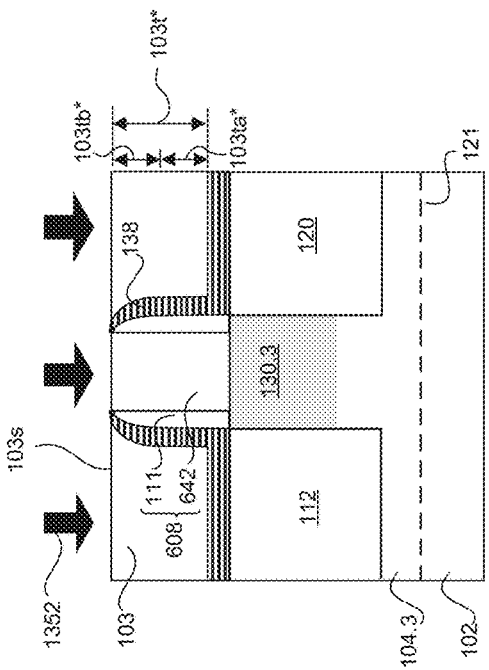
FIG. 13

INTERLAYER DIELECTRIC FILM IN SEMICONDUCTOR DEVICES

CROSS REFERENCE TO RELATED APPLICATIONS

This application is a divisional of U.S. patent application Ser. No. 14/882,865, filed Oct. 14, 2015, which is hereby incorporated by reference in its entirety.

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down dimension of semiconductor devices, such as metal oxide semiconductor field effect transistors (MOSFETs), and finFETs, and also increase packing density of these semiconductor devices on an integrated circuit (IC) to accommodate a larger number of the semiconductor devices on an IC.

Such scaling down has increased the complexity of processing and manufacturing of the semiconductor devices in ICs.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-15 are perspective and cross-sectional views of a finFET at various stages of its fabrication process, in accordance with some embodiments.

Illustrative embodiments will now be described with reference to the accompanying drawings. In the drawings, like reference numbers generally indicate identical, functionally similar, and/or structurally similar elements.

DETAILED DESCRIPTION

Figure 2:
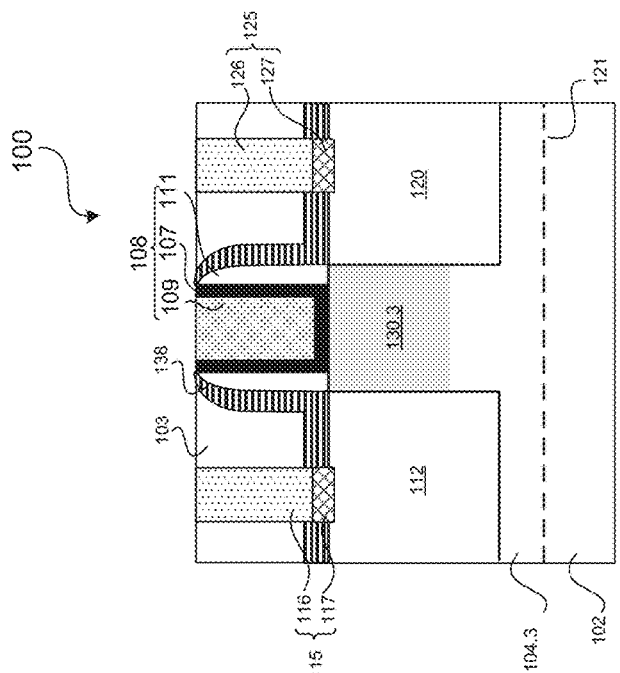
FIG. 2 is a cross-sectional view of a finFET, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with, an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio between the etch rates of two materials under the same etching conditions.

As used herein the term "substrate" describes a material onto which subsequent material layers are added. The substrate itself may be patterned and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

An Exemplary FinFET

Figure 1:
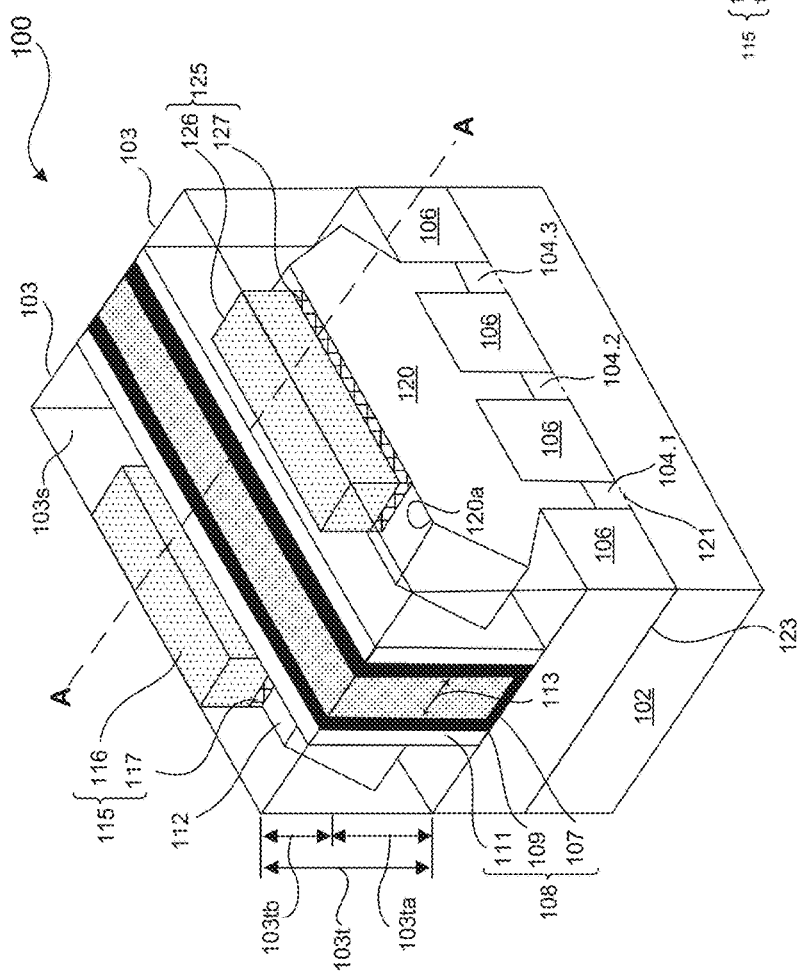
FIG. 1 is a perspective view of a finFET, in accordance with some embodiments.

FIG. 1 is a perspective view of finFET 100, according to an embodiment. FinFET 100 refers to any fin-based, multi-gate transistor. FinFET 100 may be included in a microprocessor, memory cell, and/or other integrated circuit (IC). Although FIG. 1 illustrates finFET 100, it is understood the IC may comprise any number of other devices comprising resistors, capacitors, inductors, fuses, etc. FIG. 1 is for illustrative purposes and is not drawn to scale. FinFET 100 is formed on a substrate 102, and includes a plurality of fins 104.1 through 104.3, a plurality of shallow trench isolation (STI) regions 106, a gate structure 108 disposed on each of the fins 104.1 through 104.3, a source region 112 disposed on one side of gate structure 108, a drain region 120 disposed on another side of gate structure 108, a source contact structure 115 disposed on source region 112, a drain contact structure 125 disposed on drain region 120, a high temperature (HT) doped interlayer dielectric (ILD) layer 103, and an etch stop layer 138 (not shown in FIG. 1; a cross-sectional view shown in FIG. 2). It is understood by those skilled in the relevant art(s) that the names "source" and "drain" can be interchangeable based on the voltage that is applied to those terminals when the transistor is operated. FIG. 1 shows one gate structure 108. There are additional gate structure(s) (not shown) similar and parallel to the gate structure 108 shown in FIG. 1. In addition, finFET 100 may include other components such as gate contacts, vias, interconnect metal layers, dielectric layers, passivation layers, etc. that are not, shown for the sake of simplicity. The perspective view of FIG. 1 is taken after the patterning (or forming) process of ILD layer 103 followed by formation of contact structures 115, and 125.

Substrate 102 represents a physical material on which finFET 100 is formed. Substrate 102 is a semiconductor material such as, but not limited to, silicon. In one embodiment, substrate 102 comprises a crystalline silicon substrate (e.g., wafer). In alternate embodiments, substrate 102 may comprise another elementary semiconductor, such as diamond or germanium; a compound semiconductor including silicon carbide, gallium arsenic, gallium phosphide, indium phosphide, indium arsenide, and/or indium antimonide; an alloy semiconductor including silicon germanium carbide, silicon germanium, gallium arsenic phosphide, gallium indium phosphide, gallium indium arsenic, gallium indium arsenic phosphide, aluminum indium arsenic, and/or aluminum gallium arsenic; or combinations thereof. Yet in other embodiments, substrate 102 may include an epitaxial layer (epi-layer), may be strained for performance enhancement, and/or may include a silicon-on-insulator (SOI) structure. Further, substrate 102 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type finFET, or alternatively configured for a p-type finFET.

Fins 104.1 through 104.3 represent current carrying structures of finFET 100. Fins 104.1, 104.2, and 104.3 include channel regions 130.1, 130.2, and 130.3, respectively (not shown in FIG. 1; a cross-sectional view of channel region 130.3 is shown in FIG. 2). Each of the channel regions 130.1 through 130.3 underlies gate structure 108 and is disposed between source and drain regions 112 and 120. Channel regions 130.1 through 130.3 provide conductive paths between source and drain regions 112 and 120 when a voltage applied to gate structure 108 turns on finFET 100. It should be noted that finFET 100 is shown in FIG. 1 as including three fins 104.1 through 104.3 for the sake of simplicity. However, as would be understood by a person of skill in the art, finFET 100 may include any suitable number of fins. This, suitable number can include a single fin as well as multiple fins similar to those illustrated in FIG. 1.

STI regions 106 provide electrical isolation of finFET 100 from neighboring active and passive elements (not illustrated in FIG. 1) integrated with or deposited onto substrate 102. Additionally, STI regions 106 provide electrical isolation between each of the fins 104.1 through 104.3 and/or between fins 104.1 through 104.3 and the neighboring active and passive elements. STI regions 106 are made of dielectric material and may comprise silicon oxide, silicon nitride, silicon oxynitride, fluoride-doped silicate glass (FSG), a low-k dielectric material, and/or other suitable insulating material, according to various embodiments. In some embodiments, STI regions 106 may include a multi-layer structure, for example, having one or more liner layers.

FinFET 100 further includes an interface 121 between fins 104.1 through 104.3 and substrate 102 and an interface 123 between STI regions 106 and substrate 102. In an embodiment, interface 121 is coplanar with interface 123. In other embodiments, interface 121 is either above or below interface 123.

Source region 112 and drain region 120 are formed on fins 104.1 through 104.3. Source and drain regions 112 and 120 may include epitaxially grown semiconductor material on recessed portions of fins 104.1 through 104.3 on either side of gate structure 108 and channel regions 130.1 through 130.3. In an embodiment, the epitaxially grown semiconductor material may be the same material as the material of substrate 102. In another embodiment, the epitaxially grown semiconductor material may be a strained semiconductor material that includes a different material from the material of substrate 102. Since the lattice constant of the strained semiconductor material is different from the material of substrate 102, channel regions 130.1 through 130.3 are strained or stressed to enable carrier mobility of the device and enhance the device performance. The strained semiconductor material may include element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP).

Further, source and drain regions 112 and 120 may be in-situ doped during the epi process. In various embodiments, the epitaxially grown source and drain regions 112 and 120 may be doped with p-type dopants, such as boron or $BF_2$; n-type dopants, such as phosphorus or arsenic; and/or combinations thereof; epitaxially grown strained SiGe source and drain regions 112 and 120 may be doped with p-type dopants, such as boron or $BF_2$, n-type dopants, such as phosphorus or arsenic, and/or combinations thereof; epitaxially grown Si source and drain regions 112 and 120 may be doped with carbon to form Si:C source and drain regions 112 and 120, phosphorous to form Si:P source and drain regions 112 and 120, or both carbon and phosphorous to form SiCP source and drain regions 112 and 120. In another embodiment, source and drain regions 112 and 120 is not in-situ doped, and an implantation process (i.e., a junction implant process) is performed to dope source and drain regions 112 and 120.

Source and drain contact structure s 115 and 125 are formed on and in substantial contact with source and drain regions 112 and 120, respectively. Source and drain contact structures 115 and 125 are configured to provide signals to source and drain regions 112 and 120, respectively. In an embodiment, source and drain contact structures 115 and 125 include conductive regions 116 and 126, and silicide regions 117 and 127, respectively. In some embodiments, the conductive regions 116 and 126 include conductive material such as W, Al, or Cu. Silicide regions 117 and 127 may provide a low resistance interface between conductive region 116 and source region 112, while silicide region 127 provides a similar interface between conductive region 126 and drain region 120. Both silicide regions 117 and 127 may comprise a metal silicide. Examples of metal used for forming metal silicide are cobalt, titanium, or nickel.

Gate structure 108 traverses each of fins 104.1 through 104.3 and wraps around a portion of each of the fins 1041 through 104.3 defining the channel regions 130.1 through 130.3 between source and drain regions 112 and 120. Gate structure 108 controls the current flowing between source and drain regions 112 and 120 through channel regions 130.1 through 130.3. Gate structure 108 includes a gate dielectric layer 107, a gate electrode layer 109, and spacers 111. In other embodiments, gate structure 108 may further include interfacial layers, capping layers, etch stop layers, and/or other suitable materials. The interfacial layers may include a dielectric material such as a silicon oxide layer ($SiO_2$) or silicon oxynitride (SiON) and help to reduce damage between gate structure 108 and fins 104.1 through 104.3. The interfacial dielectric layers may be formed by chemical oxidation, thermal oxidation, atomic layer deposition (ALD), chemical vapor deposition (CVD), and/or other suitable formation process.

Gate dielectric layer 107 may include silicon oxide formed by CVD, PVD, ALD, e-beam evaporation, or other suitable process. In some embodiments, gate dielectric layer 107 may include one or more layers of silicon oxide, silicon nitride, silicon oxy-nitride, or high-k dielectric materials such as hafnium oxide ($HfO_2$), $TiO_2$, HfZrO, $Ta_2O_3$, $HfSiO_4$, $ZrO_2$, $ZrSiO_2$, or combinations thereof. Alternatively, high-k dielectric materials may comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The high-k dielectric layer may be formed by atomic layer deposition (ALD) and/or other suitable methods. In some embodiments, a thickness of gate dielectric layer 107 is in the range of about 1 nm to about 5 nm. In some embodiments, gate dielectric layer 107 may include an interfacial layer made of silicon dioxide. In some embodiments, gate dielectric layer 107 may comprise a single layer or a stack of insulating material layers.

Gate electrode layer 109 may be doped poly-silicon with uniform or non-uniform doping. In some alternative embodiments, gate electrode layer 109 includes a work function metal. Exemplary p-type work function metals that may be included in gate electrode layer 109 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in gate electrode layer 109 include Ti, Ag, TaAl, TaAlC, TiAlN, TaC, TaCN, TaSiN, Mn, Zr, other suitable n-type work function materials, or combinations thereof. A work function value is associated with the material composition of the work function metal layer, and thus, the material of the first work function layer of gate electrode layer 109 is chosen to tune its work function value so that a desired threshold voltage Vt is achieved in the device that is to be formed in the respective region. Gate electrode layer 109 may be formed using a suitable process such as ALD, CVD, PVD, plating, or combinations thereof. The width 113 of gate electrode layer 109 is in the range of about 30 nm to about 60 nm in some embodiments.

High temperature (HT) doped ILD layer 103 disposed on finFET 100 and is configured to electrically isolate source contact structure 115, drain contact structure 125, and gate structure 108 from each other. In some embodiments, HT doped ILD layer 103 may be configured to electrically isolate finFET 100 from other devices and/or function units on an IC comprising finFET 100. HT doped ILD layer 103 may isolate finFET 100 from upper levels of metallization used to interconnect various components formed on substrate 102 into functional integrated circuits, such as microprocessors, digital signal processors and memory devices.

In some embodiments, HT doped ILD layer 103 is formed from physically densifying and/or chemically converting flowable dielectric material(s) into dielectric materials such as silicon oxide, silicon nitride. In an embodiment, ILD layer 103 is formed from annealing and high temperature (HT) doping flowable dielectric materials into silicon oxide. In some embodiments, flowable dielectric materials may primarily include silicon nitride, silicon oxynitride, silicon carbide, or silicon oxycarbide. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TOPS), a perhydro-polysilazane (PSZ), a tetraethyl orthosilicate (TEOS), or a silyl-amine, such as trisilylamine (TSA). The flowable dielectric materials are formed in a flowable CVD (FCVD) process. In some embodiments, annealing and/or HT doping of deposited flowable dielectric materials helps to remove undesired element(s) to densify the deposited flowable dielectric material. Materials used for doping these flowable dielectric materials may include silicon, germanium, oxygen, nitrogen, or any combination thereof, or any element(s) that does not alter and/or degrade the dielectric properties of ILD layer 103. The HT doping process to form HT doped ILD layer 103 improves structural density of the dielectric material of the HT doped ILD layer 103. For example, such improvement in structural density substantially reduces the wet etch rate (WER) of HT doped ILD layer 103 by about 30% to about 50% compared to the WER of ILD layers used in current fabrication technology of finFETs that are formed without the HT doping process.

The ILD layers used in current fabrication technology of finFETs often suffers from undercutting of the ILD layer during formation of contact structures in the ILD layers. The undercutting leads to formation of undesired cavities in the ILD layers. These undesired cavities can be filled with metal during deposition of metal in etched contact openings. The filled cavities can often create conductive paths, for example, between contact structures of adjacent finFETs and cause shorting between adjacent finFETs.

An Example Cross-Sectional View of the Exemplary FinFET

FIG. 2 is a cross-sectional view of finFET 100 through substrate 102, fin 104.3, gate structure 108, source region 112, source contact structure 115, drain region 120, drain contact structure 125, high temperature (HT) doped ILD layer 103, and etch stop layer 138 along line A-A in FIG. 1. The cross-sectional view of FIG. 2 is taken after the patterning (or forming) process of contact structures 115, and 125 in HT doped ILD layer 103 and etch stop layer 138. It should be noted that the exemplary illustration of finFET 100 in FIG. 1 and the exemplary illustration of finFET 100 along line A-A in FIG. 2 may not be to scale. Those skilled in the relevant art(s) will recognize that FIG. 2 is intended to describe additional structures of finFET 100 as well as further describe those structures of finFET 100 that are illustrated in FIG. 1. Those skilled in the relevant art(s) will additionally recognize that finFET 100 need not include all of the additional structures of finFET 100 as illustrated in FIG. 2 without departing from the spirit and scope of this disclosure. Rather, different structures, configurations, and arrangements, as well as different configurations and arrangements for the structures described in FIGS. 1 and 2 are possible for finFET 100.

As illustrated in FIG. 2, fin 104.3 is disposed on substrate 102. A first portion of fin 140.3 underlying gate structure 108 and between source and drain regions 112 and 120 includes channel region 130.3. Source and drain regions 112 and 120 are disposed on and in substantial contact with a second portion and a third portion of fin 104.3, respectively. The first portion of fin 104.3 is interposed between the second and third portions of fin 104.3 that are not underlying gate structure 108. Gate structure 108 is disposed on the first portion of fin 104.3. Gate dielectric layer 107 is in substantial contact with gate electrode layer 109 and isolates gate electrode layer 109 from fin 104.3. Spacers 111 are in substantial contact with gate dielectric layer 109 and helps to protect the integrity of gate structure 108 during subsequent processing of finFET 100. Source contact structure 115 is in substantial contact with source region 112, etch stop layer 138, and HT doped ILD layer 103. Similarly, drain contact structure 125 is in substantial contact with drain region 120, etch stop layer 138, and HT doped ILD layer 103. HT doped ILD layer 103 is configured to electrically isolate source contact structure 115, drain contact structure 125, and gate structure 108 from each other.

Etch stop layer 138l may be used as a mask layer and a protective layer to protect source region 112 and drain region 120 during formation of source contact structure 115 and drain contact structure 125. In some embodiments, etch stop layer 138 may be formed of materials including, but not limited to, $SiN_x$, $SiO_x$, SiON, SiC, SiCN, BN, SiBN, SiCBN, and combinations thereof. Etch stop layer 138 may be formed using plasma enhanced chemical vapor deposition (PECVD), sub atmospheric chemical vapor deposition (SACVD), low pressure chemical vapor deposition (LP-CVD), ALD, high-density plasma (HDP), plasma enhanced atomic layer deposition (PEALD), molecular layer deposition (MID), plasma impulse chemical vapor deposition (PICVD), or other suitable deposition methods. In an embodiment, etch stop layer 138 includes a thickness in a range from about 20 nm to 200 nm. In another embodiment, etch stop layer 138 has a thickness in a range from about 20 nm to about 100 nm.

An Example Method for Fabricating a FinFET According to an Embodiment

FIGS. 3-15 are various prospective and cross-sectional views of finFET 100 (as illustrated in FIGS. 1 and 2) at various stages of fabrication, according to some embodiments.

Figure 3:
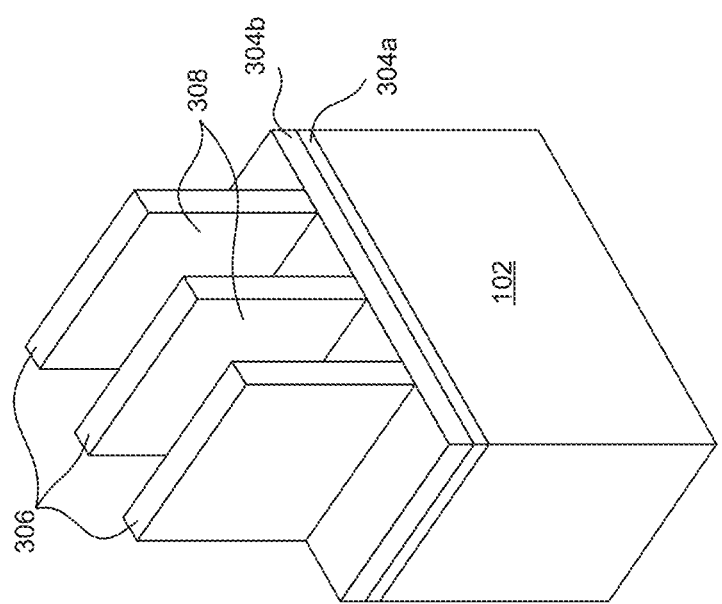

FIG. 3 is a perspective view of a partially fabricated finFET 100 after patterning of substrate 102 for formation of fins 104.1 through 104.3, according to an embodiment. Fins 104.1 through 104.3 are formed by etching into substrate 102. In one embodiment, a pad layer 304a and a mask layer 304b are formed on the semiconductor substrate 102. Pad layer 304a may be a thin film comprising silicon oxide formed, for example, using a thermal oxidation process. Pad layer 304a may act as an adhesion layer between substrate 102 and mask layer 304b. Pad layer 304a may also act as an etch stop layer for etching mask layer 304b. In an embodiment, mask layer 304b is formed of silicon nitride, for example, using LPCVD or PECVD. Mask layer 304b is used as a hard mask during subsequent photolithography processes. A photo-sensitive layer 306 is formed on mask layer 304b and is then patterned, forming openings 308 in photo-sensitive layer 306.

Figure 4:
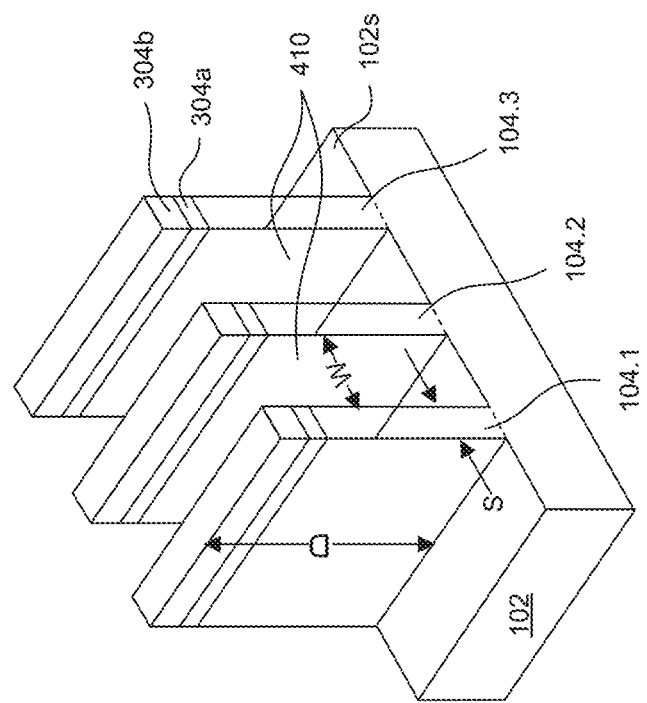

FIG. 4 is a perspective view of a partially fabricated finFET 100 after the formation of fins 104.1 through 104.3, according to an embodiment. Mask layer 304b and pad layer 304a are etched through openings 308 to expose underlying substrate 102. The exposed substrate 102 is then etched to form trenches 410 with top surfaces 102s of substrate 102. Portions of substrate 102 between trenches 410 form fins 104.1 through 104.3. Photo-sensitive layer 306 is then removed. Next, a cleaning may be performed to remove a native oxide of the semiconductor substrate 102. The cleaning may be performed using diluted hydrofluoric (DHF) acid.

In some embodiments, trenches 410 may be spaced apart from adjacent trenches by a spacing S smaller than about 30 nm and depth D of trenches 410 may range from about 210 nm to about 250 nm while width W of trenches 410 ranges from about 30 nm to about 150 nm. In an embodiment, the aspect ratio (D/W) of trenches 410 is greater than about 7.0. In some other embodiments, the aspect ratio may even be greater than about 8.0. In yet some embodiments, the aspect ratio is lower than about 7.0 or between about 7.0 and about 8.0.

Figure 5:
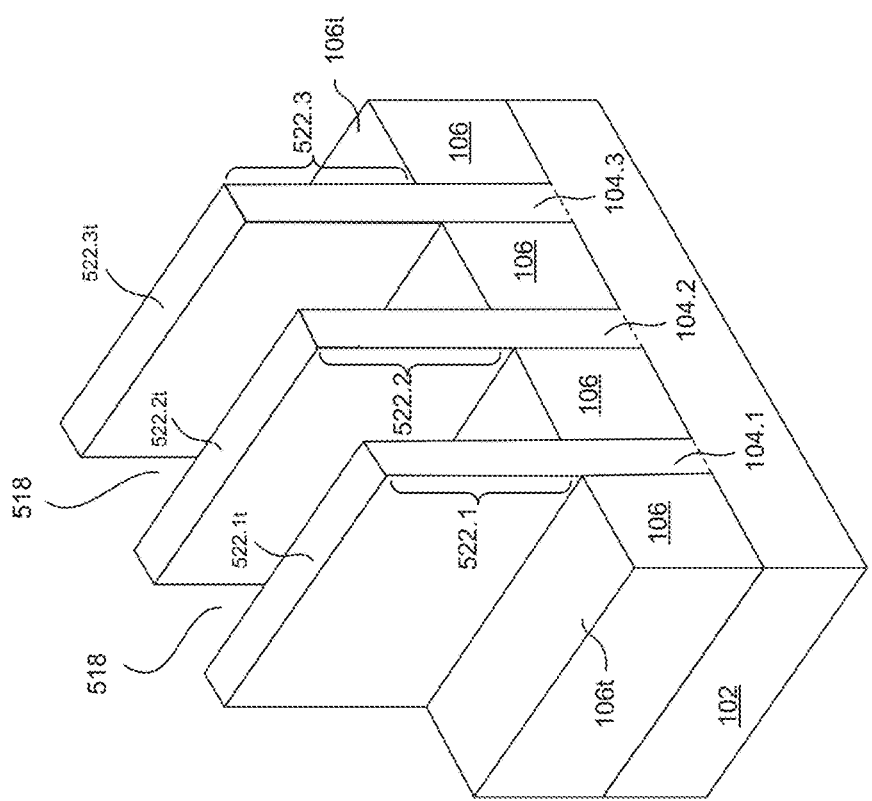

FIG. 5 is a perspective view of a partially fabricated finFET 100 after the formation of STI regions 106, according to an embodiment. The formation of STI regions involves deposition and etching of a dielectric material. Trenches 410 are filled with a dielectric material. The dielectric material may include silicon oxide. In some embodiments, other dielectric materials, such as silicon nitride, silicon oxynitride, fluoride-doped silicate glass (FSG), or a low-K dielectric material, may also be used. In an embodiment, the dielectric material may be formed using a high-density-plasma (HDP) CVD process, using silane ($SiH_4$) and oxygen ($O_2$) as reacting precursors. In other embodiments, the dielectric material may be formed using a sub-atmospheric CVD (SACVD) process or high aspect-ratio process (HARP), wherein process gases may comprise tetraethylorthosilicate (TEOS) and/or ozone ($O_3$). In yet other embodiments, the dielectric material may be formed using a spin-on-dielectric (SOD) process, such as hydrogen silsesquioxane (HSQ) or methyl silsesquioxane (MSQ).

A chemical mechanical polish or a wet etch process is then performed for the removal of mask layer 304b and pad layer 304a. This removal is followed by an etching of the dielectric material to form STI regions 106 and recessed regions 518 as shown in FIG. 5. In one embodiment, the etching of the dielectric material may be performed using a wet etching process, for example, by dipping substrate 102 in hydrofluoric acid (HF). In another embodiment, the etching operation may be performed using a dry etching process, for example, the dry etching process may be performed using $CHF_3$ or $BF_3$ as etching gases. The upper portions 522.1 through 522.3 of fins 104.1 through 104.3, respectively, protruding over the flat top surfaces 106t of STI regions 106 are used to form channel regions 130.1 through 130.3 of finFET 100. The upper portions 522.1 through 522.3 may comprise top surfaces 522.1t through 522.3t, respectively. In some embodiments, flat top surfaces 106t of STI regions 106 are lower than top surfaces 522.1t through 522.3t. In an embodiment, a vertical dimension of each of the upper portions 522.1 through 522.3 may range from about 15 nm to about 50 nm. In another embodiment, a vertical dimension of each of the upper portions 522.1 through 522.3 may range from about 20 nm to about 40 nm. Yet in another embodiment, a vertical dimension of each of the upper portions 522.1 through 522.3 may range from about 25 nm to about 35 nm.

Figure 6:
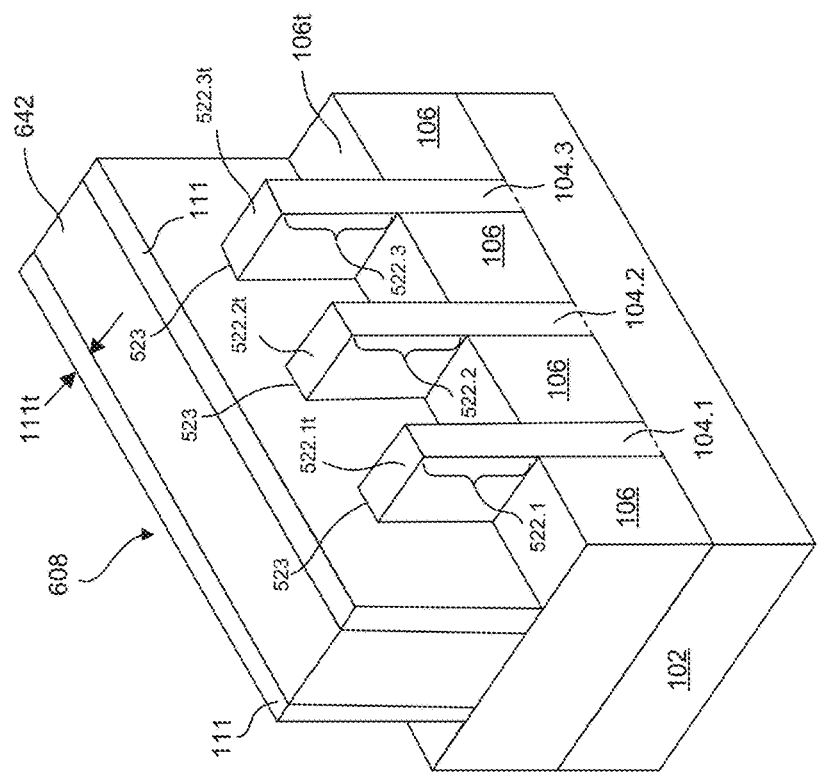

FIG. 6 is a perspective view of a partially fabricated finFET 100 after the formation of a dummy gate structure 608 on fins 104.1 through 104.3 and STI regions 106, according to an embodiment. Dummy gate structure 608 includes a polysilicon layer 642 and spacers 111. Polysilicon layer 642 and spacers 111 are formed over top surfaces 106t of STI regions 106 and over top surfaces 522.1t through 522.3t to wrap around the upper portions 522.1 through 522.3. Interfaces 523 are formed between the upper portions 522.1 through 522.3 and polysilicon layer 642 and spacers 111. Polysilicon layer 642 is formed by any suitable process or processes. For example, polysilicon layer 642 can be formed by a procedure including deposition, photolithography patterning, and etching processes. The deposition processes include chemical vapor deposition (CVD), physical vapor deposition (PVD), atomic layer deposition (ALD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). Spacers 111 may include dielectric material such as silicon oxide, silicon carbide, silicon nitride, silicon oxy-nitride, or other suitable material. Spacers 111 may comprise a single layer or multilayer structure. A blanket layer of a dielectric material may be formed by CVD, PVD, ALD, or other suitable technique followed by an anisotropic etching on the dielectric material to form the spacers 111 on two sides of polysilicon layer 642. Each of the spacers 111 comprises a thickness lilt in a range from about 5 nm to about 15 nm.

Figure 7:
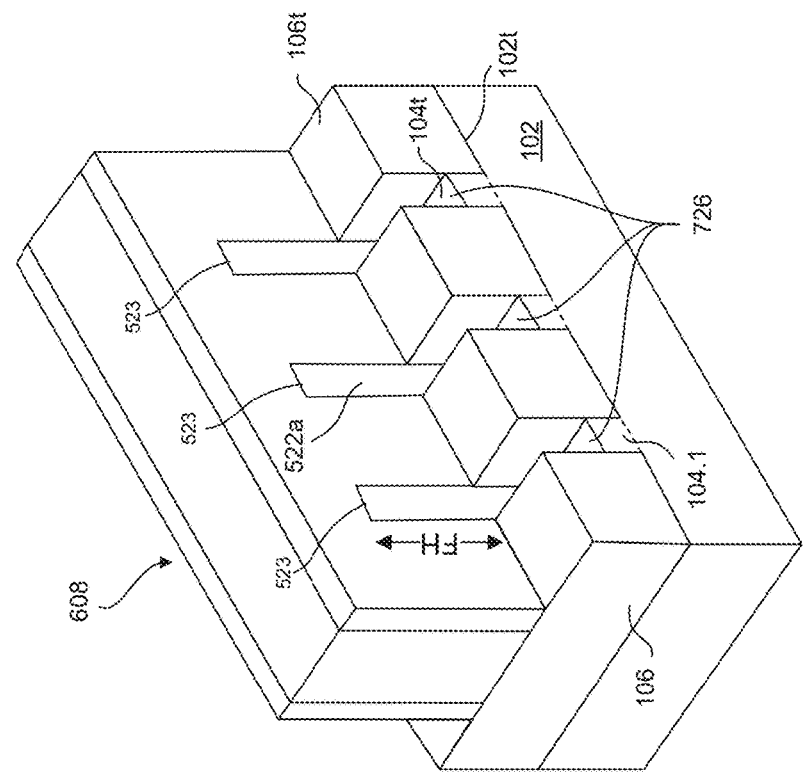

FIG. 7 is a perspective view of a partially fabricated finFET 100 after the formation of recessed portions 726 of fins 104.1 through 104.3, according to an embodiment. The portions of fins 104.1 through 104.3 that are not covered by dummy gate structure 608 are recessed to form recessed portions 726 of fins 104.1 through 104.3 having top surfaces 104$t$. In an embodiment, top surfaces 104$t$ of recessed portions 726 is below the flat top surfaces 106$t$ of STI regions 106. In alternate embodiments, the portions of fins 104.1 through 104.3 that are not covered by dummy gate structure 608 are recessed to expose top surface 102$t$ of substrate 102. In one embodiment, using spacers 111 as masks, a biased etching process is performed to form recessed portions 726. In an embodiment, the etching process may be performed under a pressure of about 1 mTorr to about 1000 mTorr, a power of about 50 W to about 1000 W, a bias voltage of about 20 V to about 500 V, at a temperature of about 40° C. to about 60° C., and using a HBr and/or Cl2 as etch gases. Also, in the embodiments provided, the bias voltage used in the etching process may be tuned to allow better control of an etching direction to achieve desired profiles for recessed portions 726.

Figure 8:
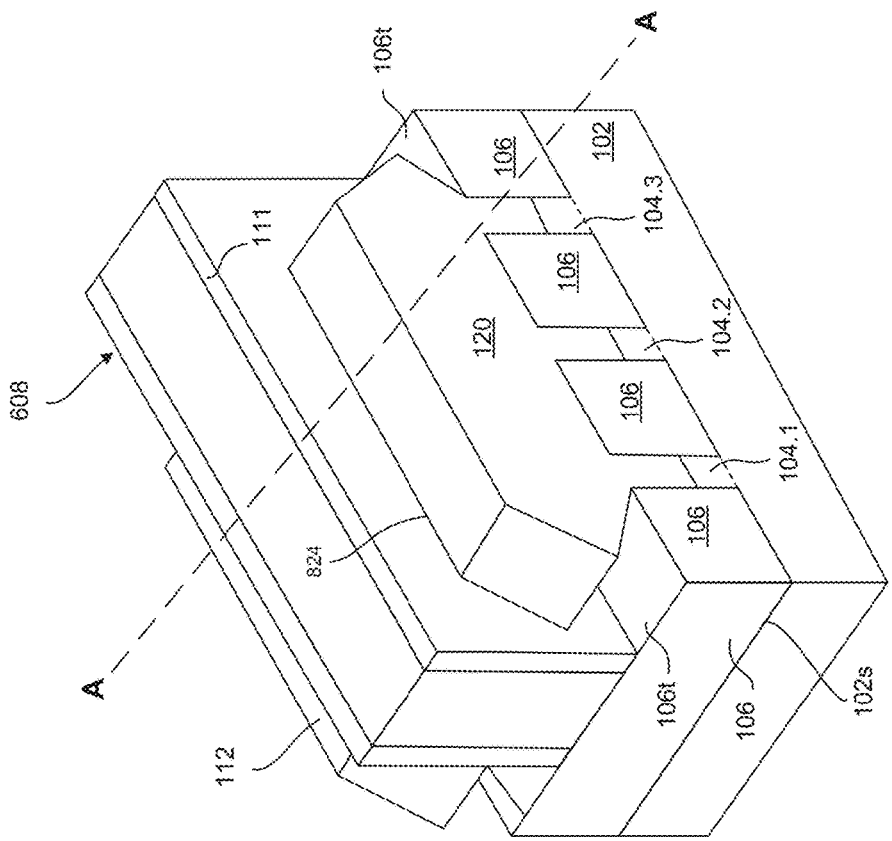

FIG. 8 is a perspective view of a partially fabricated finFET 100 after the formation of source and drain regions 112 and 120 on recessed portions 726 of fins 104.1 through 104.3, according to an embodiment. Source and drain regions 112 and 120 include epitaxially grown strained semiconductor material on recessed portions 726 of fins 104.1 through 104.3. Strained semiconductor material of source and drain regions 112 and 120 are selectively and epitaxially grown over recessed portions 726. In some embodiments, the selective epitaxial growth of the strained semiconductor material of source and drain regions 112 and 120 continues until the strained semiconductor material extends vertically a distance in a range from about 10 nm to about 100 nm above top surface 102$s$ of substrate 102 and extends laterally over top surfaces 106$t$ of some of the STI regions 106. The strained semiconductor material includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (Site), gallium arsenide phosphide (GaAsP). The epitaxial processes for growing the strained semiconductor material may include CVD deposition techniques (e.g., LPCVD, vapor-phase epitaxy (VPE) and/or ultra-high vacuum CVD (UHV-CVD)), molecular beam epitaxy, and/or other suitable processes. In an embodiment, the strained semiconductor material, such as silicon carbon (SiC), is epi-grown by a LPCVD process to form the source and drain regions 112 and 120 of an n-type finFET 100. The LPCVD process is performed at a temperature of about 400 to about 800° C. and under a pressure of about 1 Torr to about 200 Torr, using $Si_3H_8$ and $SiH_3CH$ as reaction gases. In another embodiment, the strained semiconductor material, such as silicon germanium (SiGe), is epi-grown by a LPCVD process to form the source and drain regions 112 and 120 of a p-type finFET 100. The LPCVD process is performed at a temperature of about 400° C. to about 800° C. and under a pressure of about 1 Torr to about 200 Torr, using $SiH_4$ and $GeH_4$ as reaction gases.

Source and drain regions 112 and 120 may be in-situ doped during the epitaxial growth of the strained semiconductor material. According to various embodiments, the epitaxially grown source and drain regions 112 and 120 may be doped with p-type dopants, such as boron or $BF_2$; n-type dopants, such as phosphorus or arsenic; and/or combinations thereof; epitaxially grown strained SiGe source and drain regions 112 and 120 may be doped with p-type dopants, such as boron or $BF_2$, n-type dopants, such as phosphorus or arsenic, and/or combinations thereof; epitaxially grown Si source and drain regions 112 and 120 may be doped with carbon to form Si:C source/drain features, phosphorous to form Si:P source/drain features, or both carbon and phosphorous to form SiCP source/drain features. In one embodiment, source and drain regions 112 and 120 are not in-situ doped, an implantation process (i.e., a junction implant process) is performed to dope source and drain regions 112 and 120. One or more annealing processes may be performed to activate source and drain regions 112 and 120. The annealing processes comprise rapid thermal annealing (RTA) and/or laser annealing processes.

Further illustrated in FIG. 8 are interfaces 824 between spacers 111 and source and drain regions 112 and 120. In an embodiment, interfaces 824 are coplanar with interfaces 523. In other embodiments, interfaces 824 are either above or below interfaces 523.

Figure 9:
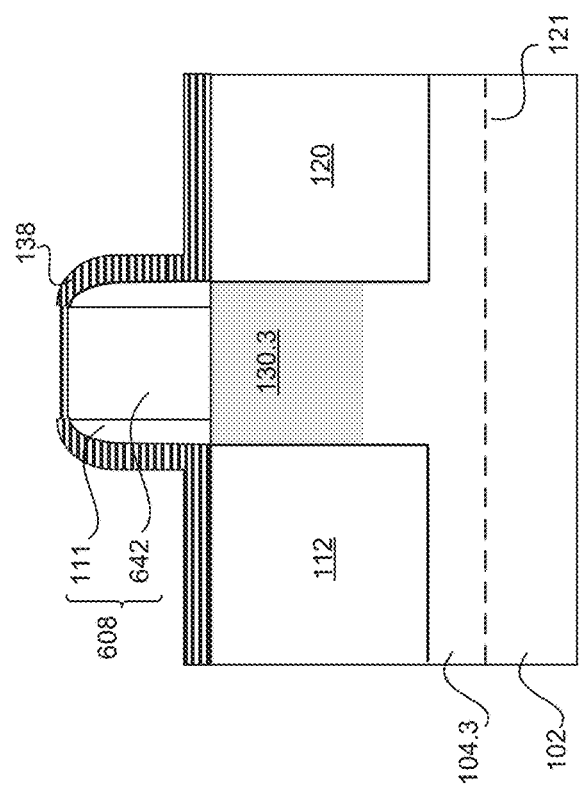

FIG. 9 is a cross-sectional view of the structure of FIG. 8 along line A-A after formation of etch stop layer 138 on dummy gate structure 608, and source and drain regions 112 and 120, according to an embodiment. Etch stop layer 138 may be formed using any suitable deposition methods. In some embodiments, etch stop layer 138 may be formed of materials including, but not limited to, $SiN_x$, $SiO_x$, SiON, SiC, SiCN, BN, SiBN, SiCBN, and combinations thereof. In some embodiments, etch stop layer 138 may include a silicon nitride formed by a LPCVD process, a silicon nitride formed by a PECVD process, tetraethyl orthosilicate formed by a CVD process, or a silicon oxide formed by HARP. In other embodiments, etch stop layer 138 may be formed using, SACVD, ALD, HDP, PEALD, MLD, PICVD, or other suitable deposition methods.

Figure 10:
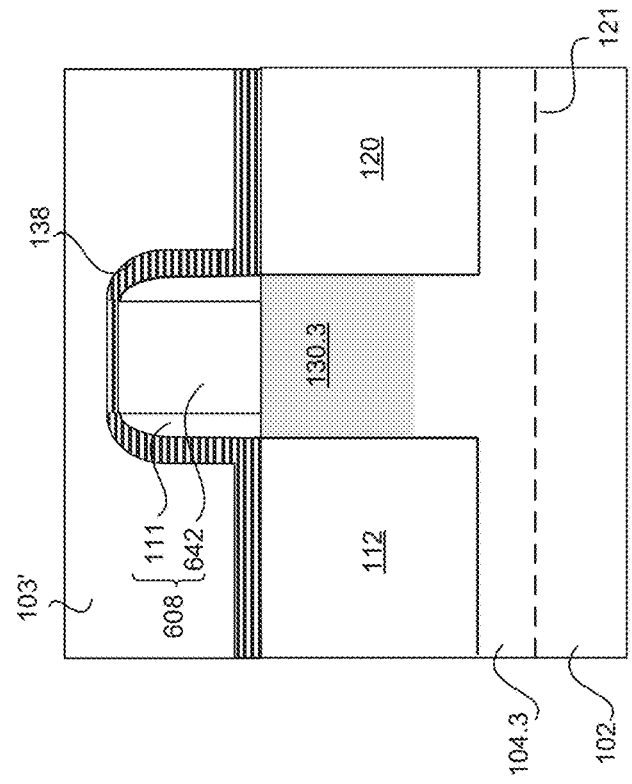

FIG. 10 shows the structure of FIG. 9 after formation of an ILD layer 103', overlying etch stop layer 138, according to an embodiment. Formation of ILD layer 103' may include deposition of ILD layer 103' followed by an annealing process. Deposition of ILD layer 103' may be performed using any deposition methods suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for ILD layer 103' using an flowable CVD (FCVD) process. ILD layer 103' formed through an FCVD process conformally covers the surface of etch stop layer 138 without any significant spaces or voids between ILD layer 103' and etch stop layer 138. Such a conformal deposition provides a good gap filling effect, for example in recessed regions between fins 104.1, 104.2, and 104.3. Next, in this illustrative method, a wet anneal process is performed on the ILD layer 103'. An illustrative wet anneal process includes annealing ILD layer 103' in steam at a temperature in a range from about 200° C. to about 700° C. for a period in a range from about 30 min to about 120 min. The wet anneal process facilitates conversion of ILD layer 103' into a Si-bond network to form silicon oxide and/or substantially remove structural defects from the Si-bond network by removing impurities, for example, residual nitrogen, hydrogen, carbon, compounds of hydrogen, compounds of carbon, or compounds of nitrogen that are present in ILD layer 103'. These impurities may be residual precursor materials used in the deposition process or byproducts formed during the deposition process of ILD layer 103'. In an embodiment, this wet annealing process reduces the flowable property of ILD layer 103' and partially converts the flowable dielectric material of ILD layer 103' into a dielectric material. Subsequent processing of ILD layer 103' as described below such as subsequent annealing and/or high temperature (HT) doping of ILD layer 103' densifies (e.g., solidifies) and converts the flowable material of ILD layer 103' into a dielectric material having negligible flowable properties. In an embodiment, the dielectric material is silicon oxide. In another embodiment, the dielectric material is silicon oxide having one or more residual impurities.

FIG. 11 shows the structure of FIG. 10 after formation of an ILD layer 103", which is formed after planarization of ILD layer 103', according to an embodiment. In this illustrative embodiment, formation of ILD layer 103" includes planarizing the annealed ILD layer 103' by chemical mechanical polishing (CMP). CMP of ILD layer 103' removes excess portions of ILD layer 103', such that top surface 103"a of ILD layer 103" is substantially coplanar with top surface 642a of polysilicon layer 642 of dummy gate structure 608. During the CMP process, a portion of etch stop layer 138 (as shown in FIG. 4) above dummy gate structure 608 is removed.

FIG. 12 shows the structure of FIG. 11 after formation of an ILD layer 103*, which is formed after a wet annealing process of ILD layer 103", according to an embodiment. Following the CMP process, a wet annealing process is performed on ILD layer 103". The wet anneal process may include annealing ILD layer 103" in steam 1250 at a temperature in a range from about 200° C. to about 700° C. for a period in a range from about 30 min to about 120 min. This wet anneal process changes the surface chemistry of ILD layer 103" by crosslinking dangling bonds on surface of ILD layer 103" and also help to improve structural density of ILD layer 103" by increasing Si—O bonds in ILD layer 103" compared to ILD layer 103'. Such improvement in surface chemistry and structural density of ILD layer 103" improves properties (e.g., wet etch rate (WER), dielectric constant, dry etch rate, and/or CMP removal rate) of ILD layer 103" compared to ILD layer 103'. It should be noted that direction and position of steam 1250 applied to finFET 100 is for illustrative purposes and is not limiting. As would be understood by a person of skill in the art, steam 1250 may be applied to finFET 100 in different configurations during the wet annealing process.

FIG. 13 shows the structure of FIG. 11 after formation of HT doped ILD layer 103 as discussed above with reference to FIGS. 1 and 2, according to an embodiment. Formation of HT doped ILD layer 103 includes HT doping of annealed ILD layer 103*. The HT doping process includes ion implantation of dopants 1352 into annealed ILD layer 103* and heating substrate 102 during the ion implantation process by providing heat energy to a substrate holder (not shown) that is configured to hold substrate 102 during the ion implantation process. In an embodiment, a heating apparatus configured to heat the substrate holder during the ion implantation is integrated with the substrate holder. The HT doping process may further include maintaining substrate 102 at a temperature in a range from about 100° C. to about 500° C., according to an embodiment. In an embodiment, the HT doping process may include maintaining substrate 102 at a temperature in a range from about 300° C. to about 500° C. In another embodiment, the HT doping process may include maintaining substrate 102 at a temperature in a range from about 450° C. to about 500° C. In an embodiment, the ion implantation includes implanting dopants such as, but not limited to, silicon, germanium, oxygen, nitrogen, or any combinations thereof, or any element(s) that does not alter and/or degrade the dielectric properties of ILD layers 103", 103*, and/or 103, at an energy in a range from about 20 keV to about 50 keV. The ion implantation process may further include implanting dopants at a dose in a range from about $2 \times 10^{14}$ atoms/cm$^2$ to about $2 \times 10^{15}$ atoms/cm$^2$, according to another embodiment. According to various embodiments, the HT doping process may take less than 5 min, less than 3 min, or less than 1 min. The ion implantation energy, dosage, duration, and temperature of substrate used during the HT doping process may be optimized to control the maximum penetration depth of the dopant atoms in HT doped ILD layer 103 such that the maximum penetration depth is substantially equal to the thickness 103t (FIG. 1) of HT doped ILD layer 103. In an embodiment, etch stop layer 138 helps to prevent the dopants from penetrating the structures of finFET 100 underlying the etch stop layer 138 during the HT doping process.

In various embodiments, the HT implanted dopants in the HT doped ILD layer 103 has a dopant concentration in a range from about $1 \times 10^{19}$ atoms/cm$^3$ to about $6 \times 10^{20}$ atoms/cm$^3$. The HT implanted dopants may be distributed throughout the HT doped ILD layer 103 and may have a non-linear doping density profile across thickness 103t (FIG. 1) and/or thickness 103t* (FIG. 13) of the HI doped ILD layer 103, according to embodiments. The doping density profile is sometimes referred to as a plot of doping concentration versus depth. The doping concentration is the concentration of dopants in HT doped ILD layer 103 and the depth is the distance from top surface 103s into HI doped ILD layer 103. In another embodiment, the HT implanted dopants in the HT doped ILD layer 103 may have a Gaussian doping density profile across thickness 103t (FIG. 1) and/or thickness 103t* (FIG. 13) of the HT doped ILD layer 103 with a tail end of the Gaussian doping density profile being at a top surface 103s of HT doped ILD layer 103. In the Gaussian doping density profile, a maximum peak concentration of the HT implanted dopants may be in a range from about $5 \times 10^{19}$ atoms/cm$^3$ to about $6 \times 10^{20}$ atoms/cm$^3$, according to various embodiments.

In alternate embodiments, the HT doping process may include a first HT doping and a second HT doping of annealed ILD layer 103*. The first HT doping process may include ion implantation of a first type of dopant(s) into annealed ILD layer 103* and heating substrate 102 during the ion implantation process. The second HT doping process may include ion implantation of a second type of dopant(s) that is different from the first type dopant(s) into annealed ILD layer 103* and heating substrate 102 during the ion implantation process. Both the first and second 111 doping process may include maintaining substrate 102 at a temperature in a range from about 100° C. to about 500° C., about 300° C. to about 500° C., or about 450° C. to about 500° C., according to some embodiments. The first and second type dopants may include dopants such as, but not limited to, silicon, germanium, oxygen, nitrogen, or any combinations thereof; or any element(s) that does not alter and/or degrade the dielectric properties of ILD layers 103", 103*, and/or 103. Both the first and second HT doping processes may include ion implantations at an energy in a range from about 20 keV to about 50 keV. The ion implantation processes may further include implanting the first and second dopants at a dose in a range from about $2 \times 10^{14}$ atoms/cm$^2$ to about $2 \times 10^{15}$ atoms/cm$^2$, according to another embodiment. The ion implantation energy, dosage, and temperature of substrate used during the first and second HT doping processes may be optimized to control the penetration depth of the first and second dopant atoms in ILD layer 103 such that a thickness 103ta (FIG. 1) of HT doped ILD layer 103 is doped with the first dopant and a thickness 103tb (FIG. 1) of HT doped ILD layer 103 is doped with the second dopant. The thicknesses 103ta and 103tb may be different or equal to each other, according to some embodiments.

The HT doping process of the annealed ILD layer 103* to form HT doped ILD layer 103 further improves structural density of the annealed ILD layer 103*. Such improvement in structural density of the annealed ILD layer 103* can help to substantially reduce the WER of HT doped ILD layer 103 compared to the WER of annealed ILD layer 103*, which is not subjected to the HT doping process. In some embodiments, the WER of HT silicon-doped ILD layer 103 is reduced by about 30% to about 50% relative to the WER of ILD layers 103" and/or 103*, which are not subjected to the HT doping process. In another example, the WER of silicon-doped ILD layer 103 that is doped at room temperature (RT) (i.e., without heating substrate 102 during the ion implantation process) is reduced by about 20% to about 30% relative to the WER of ILD layers 103" and/or 103*, which are not subjected to the RT doping process. Reduction in the WER of HT doped ILD layer 103 improves etch process control of HT doped ILD layer 103 during subsequent processing of HT doped ILD layer 103 and/or finFET 100. Current fabrication technology of finFETs suffers from, for example, undercutting of the ILD during contact etching that leads to undesired cavities in the ILD layer. These undesired cavities can be filled with metal during deposition of metal within the etched contact openings and subsequently, provide shorting between conductive structures in finFETs, which results in fabrication of defective finFETs.

In alternate embodiments, the HT doping process may be performed after the planarization process and before the wet annealing process described with respect to FIGS. 11 and 12, respectively.

In some embodiments, HT doped ILD 103 may also include other dopants for achieving mobile ion-gettering. In some embodiments, HT doped ILD layer 103 may be further doped with phosphorus atoms for achieving mobile ion-gettering.

Figure 14:
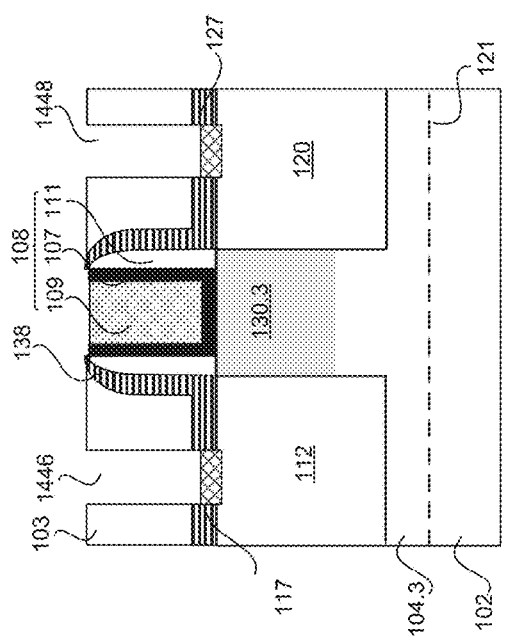

FIG. 14 shows the structure of FIG. 13, after replacement of polysilicon layer 642 of dummy gate structure 608 with gate electrode layer 109 and gate dielectric layer 107, formation of contact openings 1446 and 1448, and formation of silicide regions 117 and 127 within contact openings 1446 and 1448, according to an embodiment. Polysilicon layer 642 may be replaced by gate electrode layer 109 and gate dielectric layer 107 using a replacement metal gate (RMG) process. Contact openings 1446 and 1448 are formed through HT doped ILD layer 103 and etch stop layer 138 at locations above source region 112 and 120, respectively. In one embodiment, the formation of contact openings 1446 and 1448 includes forming a layer of photoresist (not shown) over HT doped ILD layer 103 by a suitable process, such as spin-on coating, patterning the layer of photoresist to form a patterned photoresist feature by a lithography method, etching the exposed portions of HT doped ILD layer 103 for example, by using a dry etching, wet etching, and/or plasma etching process to remove the exposed portions of HT doped ILD layer 103 and corresponding portions of etch stop layer 138 over source and drain regions 112 and 120. Due to the reduction in the WER and improvement in structural density of HT doped ILD layer 103, undercutting and/or the formation of undesired cavities in the HT doped ILD layer 103 during the etching of the HT doped ILD layer 103 is substantially eliminated. The patterned photoresist layer may be stripped thereafter. It is noted that cross-sectional shape of contact openings 1446 and 1448 shown in FIG. 14 is for illustrative purposes, and is not limiting. Contact openings 1446 and 1448 may have other cross-sectional shapes.

Following the etching of contact openings 1446 and 1448, a silicidation process on source region 112 and drain region 120 may be performed to form silicide regions 117 and 127 within contact openings 1446 and 1448, respectively. Both silicide regions 117 and 127 may comprise a metal silicide. Examples of metal used for forming metal silicide are cobalt, titanium, or nickel. In some embodiments, formation of silicide regions 117 and 127 includes deposition of titanium and titanium nitride into contact openings 1446 and 1448 followed by a rapid thermal annealing process at a temperature in a range from about 700° C. to about 900° C.

Figure 15:
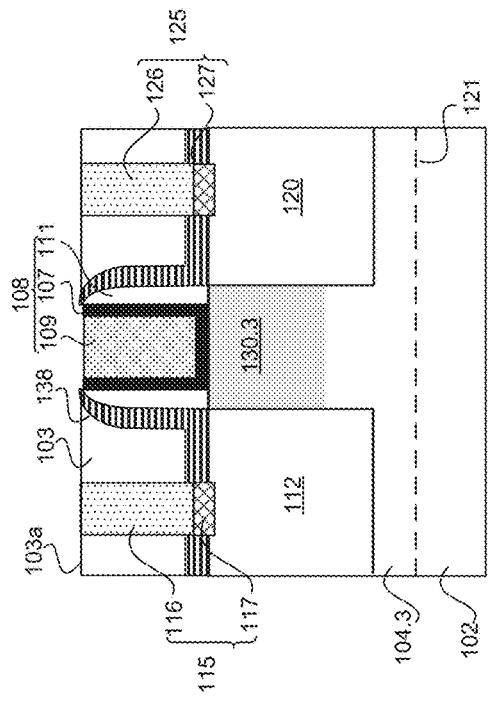

FIG. 15 shows the structure of FIG. 14 after formation of conductive regions 116 and 126 of source contact structure 115 and drain contact structure 125, respectively, according to an embodiment. Conductive regions 116 and 126 may be formed by depositing any suitable conductive material. In some embodiments, the conductive material comprises W, Al, or Cu. In some embodiments, the conductive material may be formed by CVD, PVD, plating, ALD, or other suitable technique. The conductive material is deposited until contact openings 116 and 126 are substantially filled or over-filled. Then, another CMP process is performed to remove a portion of the conductive material outside of the contact openings 116 and 126. The CMP process may stop when reaching top surface 103a of HT doped ILD layer 103, and thus providing a substantially planar surface.

Improvement in structural density of HT doped ILD layer 103 and reduction in the wet etch rate (WER) of HT doped ILD layer 103 by about 30% to about 50% relative to the WER of ILD layers 103" and/or 103*, which are not subjected to the HT doping process, improves control of the wet etch process of HT doped ILD layer 103 compared to ILD layers 103" and/or 103*, which are not subjected to the HT doping process. This reduction in the WER and improvement in structural density helps to prevent undercutting and forming of undesired cavities in HT doped ILD layer 103.

Figure 16B:
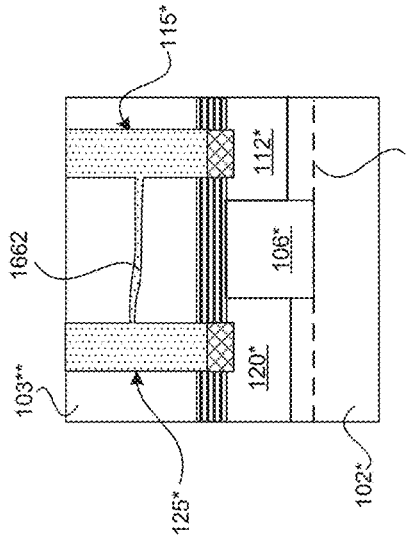
FIGS. 16A-16B are cross-sectional views of adjacent finFETs, in accordance with some embodiments.
Figure 16A:
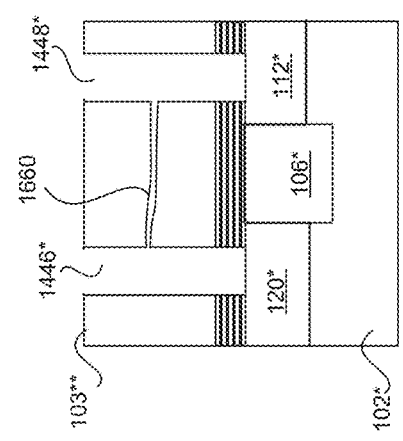

For example, as illustrated in FIG. 16A, a cavity such as cavity 1660 may be formed in an ILD layer 103, which is not subjected to the HT doping process, during etching of the ILD layer 103 to form contact openings 1446* and 1448*. This cavity 1660 may be formed due to a weaker structural density of the ILD layer 103 compared to the HT doped ILD layer 103 even though the etching process of the ILD layer 103 is similar to the etching process of HT doped ILD layer 103 described with respect to FIG. 14. As illustrated in FIG. 16A, contact openings 1446* and 1448* are formed in two adjacent finFETs having a drain region 120* and a source region 112*, respectively, that are electrically isolated from each other by an STI region 106* on a substrate 102*. This cavity 1660 may be filled with a metal to form a metal filled cavity 1662 (illustrated in FIG. 16B) during metal deposition process to form contact structures 125* and 115* similar to contact structures 115 and 125, as described with respect to FIG. 15. Formation of such metal cavity 1662 cause shorting between contacts structures 125* and 115* of adjacent finFETs and as a result, cause degradation of device performance.

Example Operations for Fabricating a FinFET According to a First Embodiment

Figures 17, 18:
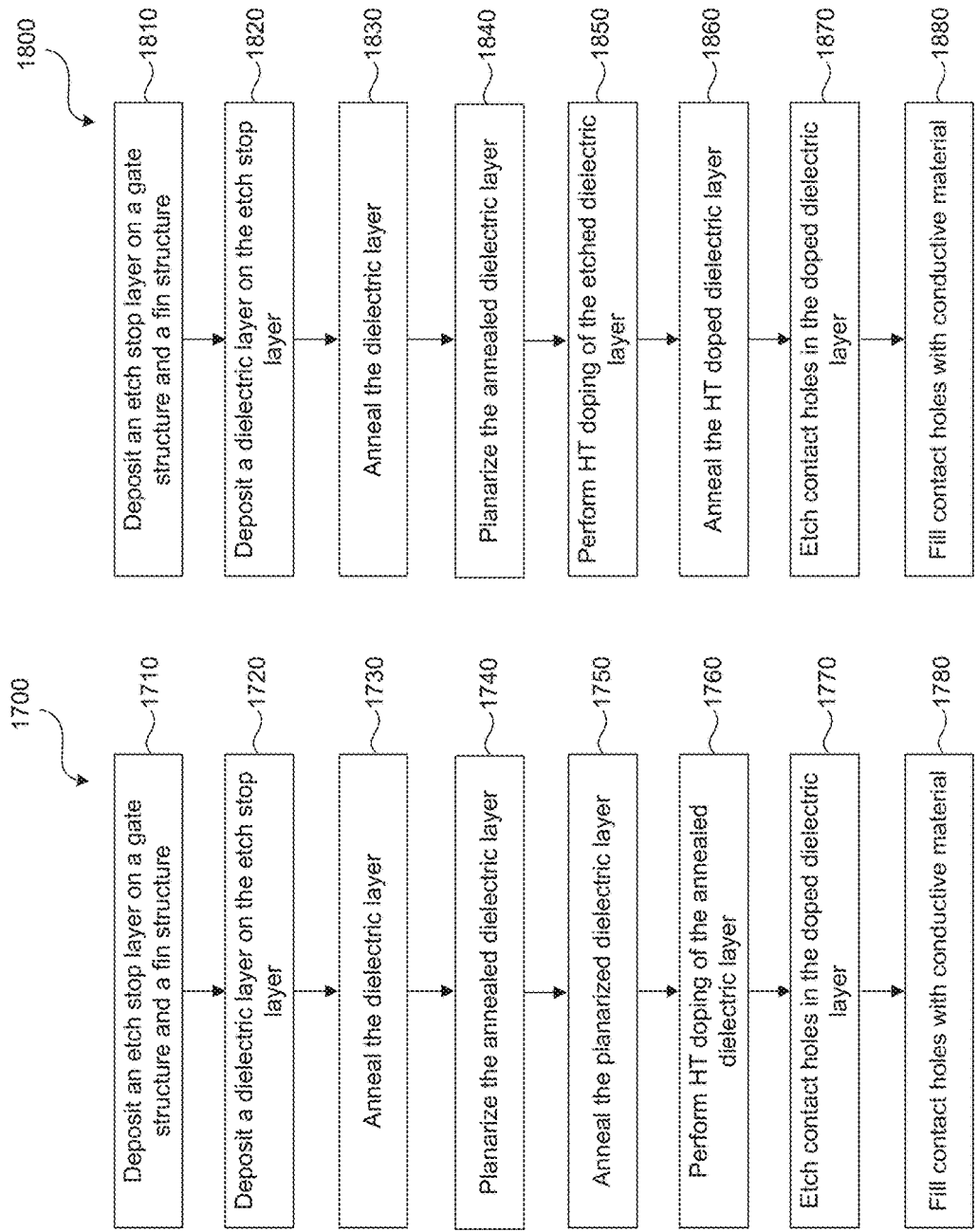
FIGS. 17-18 are flow diagrams of methods for fabricating a finFET, in accordance with some embodiments.

FIG. 17 is a flow diagram of an exemplary method 1700 for fabricating finFET 100. Solely for illustrative purposes, the operations illustrated in FIG. 17 will be described with reference to the example fabrication process illustrated in FIGS. 9-15. Operations can be performed in a different order or not performed depending on specific applications. It should be noted that method 1700 does not produce a completed finFET 100. Accordingly, it is understood that additional processes may be provided before, during, and after method 1700, and that some other processes may only be briefly described herein.

In operation 1710, an etch stop layer is deposited on a gate structure and source and drain regions. For example, an etch stop layer such as etch stop layer 138 may be formed on dummy gate structure 608 and source and drain regions 112 and 120. Etch stop layer 138 may be deposited using any suitable deposition methods for materials such as silicon nitride, silicon oxynitride, silicon carbide, or silicon oxycarbide. For example, silicon nitride may be deposited for etch stop layer 138 using a CVD process.

In operation 1720, a dielectric layer is deposited on the etch stop layer of operation 1710. For example, a dielectric layer such as ILD layer 103' may be formed on etch stop layer 138. ILD layer 103' may be deposited using any deposition methods suitable for flowable dielectric materials. For example, flowable silicon oxide may be deposited for ILD layer 103' using FCVD process.

In operation 1730, the dielectric layer of operation 1720 is annealed. For example, the dielectric layer of operation 1720 may be subjected to a wet annealing process such as the wet annealing process performed on ILD layer 103'. The wet annealing process may include annealing the dielectric layer of operation 1720 in steam at a temperature in a range from about 200° C. to about 700° C. for a period in a range from about 30 min to about 120 min.

In operation 1740, the annealed dielectric layer of operation 1730 is planarized. For example, the annealed dielectric layer of operation 1730 is planarized using a CMP process.

In operation 1750, the planarized dielectric layer of operation 1740 is annealed. For example, the planarized dielectric layer of operation 1740 is subjected to a wet annealing process such as the wet annealing process performed on ILD layer 103". The illustrative wet annealing process includes annealing the planarized dielectric layer of operation 1740 in steam at a temperature in a range from about 200° C. to about 700° C. for a period in a range from about 30 min to about 120 min.

In operation 1760, a high temperature (HT) doping process is performed on the annealed dielectric layer of operation 1750. For example, the annealed dielectric layer of operation 1750 may be subjected to the HT doping process performed on ILD layer 103* to form HT doped. ILD layer 103. The HT doping process includes ion implantation of dopants into the annealed dielectric layer of operation 1750 and concurrently providing thermal energy to the substrate to heat the substrate to a target temperature or temperature range, or maintain the substrate at the target temperature or temperature range. The thermal energy is provided to the substrate such as substrate 102 during the ion implantation process by providing thermal energy to a substrate holder (not shown) that is configured to hold substrate 102 during the ion implantation process, according to an embodiment. The HT doping process may further include maintaining substrate 102 at a temperature in a range from about 100° C. to about 500° C., according to various embodiments. In an embodiment, the ion implantation process may include implanting dopants such as, but not limited to, silicon, germanium, oxygen, nitrogen, or any combinations thereof, or any element(s) that does not alter and/or degrade the dielectric properties of ILD layers 103", 103*, and/or 103, at an energy in a range from about 20 keV to about 50 keV. The ion implantation process may further include implanting dopants at a dose in a range from about $2\times10^{14}$ atoms/cm$^2$ to about $2\times10^{15}$ atoms/cm$^2$, according to some embodiment.

In operation 1770, contact openings are etched in the HT doped dielectric layer of operation 1760. For example, contact openings 1346 and 1348 may be etched in HT doped ILD layer 103 using a dry etch process.

In operation 1780, contact openings of operation 1770 are filled with conductive material. For example, contact openings 1446 and 1448 may be filled by depositing any suitable conductive material. In some embodiments, the conductive material comprises W, Al, or Cu. In some embodiments, the conductive material may be formed by CVD, PVD, plating, ALD, or other suitable technique.

Example Operations for Fabricating a FinFET According to a Second Embodiment

FIG. 18 is a flow diagram 1800 of an exemplary method for fabricating finFET 100 and contacts to its source and drain regions. Solely for illustrative purposes, the operations illustrated in FIG. 18 will be described with reference to example fabrication process illustrated in FIGS. 9-15. Operations can be performed in a different order or not performed depending on specific applications. It should be noted that method 1800 does not produce a completed finFET 100. Accordingly, it is understood that additional processes may be provided before, during, and after method 1800, and that some other processes may only be briefly described herein.

In operation 1810, an etch stop layer is deposited on a gate structure and source and drain regions. For example, an etch stop layer such as etch stop layer 138 may be formed on dummy gate structure 608 and source and drain regions 112 and 120. Etch stop layer 138 may be deposited using any suitable deposition methods for materials such as silicon nitride, silicon oxynitride, silicon carbide, or silicon oxycarbide. For example, silicon nitride may be deposited for etch stop layer 138 using a CVD process.

In operation 1820, a dielectric layer is deposited on the etch stop layer of operation 1810. For example, a dielectric layer such as ILD layer 103' may be formed on etch stop layer 138. ILD layer 103" may be deposited using any deposition methods suitable for flowable dielectric materials. For example, flowable silicon oxide may be deposited for ILD layer 103' using FCVD process.

In operation 1830, the dielectric layer of operation 1820 is annealed. For example, the dielectric layer of operation 1820 is subjected to a wet annealing process such as the wet annealing process performed on ILD layer 103'. The illustrative wet annealing process includes annealing the dielectric layer of operation 1820 in steam at a temperature in a range from about 200° C. to about 700° C. for a period in a range from about 30 min to about 120 min.

In operation 1840, the annealed dielectric layer of operation 1830 is planarized. For example, the annealed dielectric layer of operation 1830 is planarized using a CMP process such as the CMP process performed on ILD layer 103' to form ILD layer 103".

In operation 1850, a high temperature (HT) doping process is performed on the planarized dielectric layer of operation 1840. For example, the planarized dielectric layer of operation 1840 is subjected to the HT doping process performed on ILD layer 103" to form HT doped ILD layer 103. The HT doping process includes ion implantation of dopants into the planarized dielectric layer of operation 1840 and heating substrate such as substrate 102 during the ion implantation process by providing heat energy to a substrate holder (not shown) that is configured to hold substrate 102 during the ion implantation process. The HT doping process may further include maintaining substrate 102 at a temperature in a range from about 100° C. to about 500° C., according to various embodiments. In an embodiment, the ion implantation process may include implanting dopants such as, but not limited to, silicon, germanium, oxygen, nitrogen, or any combinations thereof, or any element(s) that does not alter and/or degrade the dielectric properties of ILD layers 103", 103*, and/or 103, at an energy in a range from about 20 keV to about 50 keV. The ion implantation process may further include implanting dopants at a dose in a range from about $2 \times 10^{14}$ atoms/cm$^2$ to about $2 \times 10^{15}$ atoms/cm$^2$, according to some embodiment.

In operation 1860, the HT doped dielectric layer of operation 1850 is annealed. For example, the HT doped dielectric layer of operation 1850 may be subjected to a wet annealing process such as the wet annealing process performed on ILD layer 103". The wet annealing process may include annealing the HT doped dielectric layer of operation 1850 in steam at a temperature in a range from about 200° C. to about 700° C. for a period in a range from about 30 min to about 120 min.

In operation 1870, contact openings are etched in the annealed dielectric layer of operation 1860. For example, contact openings 1446 and 1448 are etched in HT doped ILD layer 103 using a dry etch process.

In operation 1880, contact openings of operation 1870 are filled with conductive material. For example, contact openings 1446 and 1448 may be filled by depositing any suitable conductive material. In some embodiments, the conductive material comprises W, Al, or Cu. In some embodiments, the conductive material may be formed by CVD, PVD, plating, ALD, or other suitable technique.

Thus, the present disclosure provides mechanisms for improving etch process control of an ILD layer by improving the structural density and the WER of the ILD layer, which includes annealing and high temperature (HT) doping of the ILD layer using ion implantation at high temperature. Improvement of the etch process control of the HT doped ILD layer helps to prevent undercutting and forming of undesired cavities in the HT doped ILD layer. The presence of undesired cavities that can be filled with metal during subsequent metal contact formation can cause shorting between conductive structures in finFETs and result in fabrication of defective finFETs.

Example Embodiments and Benefits

In an embodiment, a method includes forming a plurality of fins on a substrate, forming a gate structure, and forming a doped strained region adjacent to the gate structure. The method further includes depositing a flowable dielectric layer on the gate structure and the doped strained region and performing a high temperature (HT) doping process on the flowable dielectric layer to form a HT doped dielectric layer. An exemplary benefit of this embodiment includes reducing the wet etch rate (WER) of the HT doped dielectric layer by about 50% compared to a flowable dielectric layer not subjected to the HT doping process described herein.

In a further embodiment, a method of modifying a property of an interlayer dielectric (ILD) layer in an integrated circuit includes forming a plurality of fins on a substrate, forming a gate structure over the plurality of fins, and depositing an etch stop layer on the gate structure. The method further includes depositing a flowable dielectric layer on the etch stop layer to form the ILD layer, performing an anneal process on the ILD layer, and performing a high temperature (HT) doping process on the ILD layer. An exemplary benefit of this embodiment includes the ability to reduce the wet etch rate (WER) of the ILD layer after being subjected to a HT doping process by about 50% compared to an ILD layer without being subjected to the HT doping process described herein.

In a still further embodiment, a semiconductor device includes a plurality of fins on a substrate, a gate structure disposed over the plurality of fins, and a doped strained region adjacent to the gate structure. The semiconductor device further includes a high temperature (HT) doped interlayer dielectric (ILD) layer disposed on the gate structure and the doped strained region, where the HT doped ILD layer includes germanium dopants, nitrogen dopants, or a combination thereof. An exemplary benefit of this embodiment includes a semiconductor device having an ILD layer that has a wet etch rate (WER) 50% lower than the WER of an ILD layer not subjected to the HT doping process described herein.

The foregoing disclosure outlines features of several embodiments so that those skilled in, the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a fin on a substrate;
a gate structure disposed over the fin;
a doped strained region adjacent to the gate structure; and
a high temperature (HT) doped interlayer dielectric (ILD) layer disposed over the doped strained region, the HT doped ILD layer comprising dopant materials with a non-linear doping density throughout the HT doped ILD layer.

2. The semiconductor device of claim 1, wherein the dopant materials comprise germanium, nitrogen, oxygen, silicon, or phosphorus.

3. The semiconductor device of claim 1, wherein an etch property of the HT doped ILD layer is based on the non-linear doping density of the dopant materials throughout the HT doped ILD layer.

4. The semiconductor device of claim 3, wherein the etch property is a wet etch rate of the HT doped ILD layer.

5. The semiconductor device of claim 1, further comprising:
spacers disposed on sidewalls of the gate structure; and
an etch stop layer disposed on the spacers and the doped strained region,
wherein the HT doped ILD layer is disposed on the etch stop layer.

6. The semiconductor device of claim 5, further comprising a contact structure within the HT doped ILD layer and the etch stop layer.

7. The semiconductor device of claim 5, further comprising a metal silicide region within the etch stop layer.

8. The semiconductor device of claim 5, wherein the etch stop layer is arranged to prevent penetration of the dopant materials into the doped strained region.

9. A semiconductor device, comprising:
a gate structure on a substrate;
a source/drain region adjacent to the gate structure; and
a high temperature (HT) doped interlayer dielectric (ILD) layer disposed over the source/drain region, wherein an etch property of the HT doped ILD layer is based on a concentration of a dopant material having a non-linear doping density profile across a vertical dimension of the HT doped ILD layer.

10. The semiconductor device of claim 9, wherein the dopant material comprises germanium, nitrogen, oxygen, or silicon.

11. The semiconductor device of claim 9, wherein the concentration of the dopant material is in a range from about $1\times10^{19}$ atoms/cm$^3$ to about $6\times10^{20}$ atoms/cm$^3$.

12. The semiconductor device of claim 9, wherein the HT doped ILD layer further comprises phosphorus dopants.

13. The semiconductor device of claim 9, wherein a peak concentration of the dopant material is in a range from about $5\times10^{19}$ atoms/cm$^3$ to about $6\times10^{20}$ atoms/cm$^3$.

14. The semiconductor device of claim 9, wherein a tail end of the non-linear doping density profile is at a top surface of the HT doped ILD layer.

15. The semiconductor device of claim 9, wherein the etch property is a wet etch rate of the HT doped ILD layer.

16. The semiconductor device of claim 9, further comprising an etch stop layer disposed on the source/drain region and arranged to prevent penetration of the dopant material into the source/drain region, wherein the HT doped ILD layer is disposed on the etch stop layer.

17. A semiconductor device, comprising:
a plurality of fins on a substrate;
a gate structure disposed over the plurality of fins;
a doped strained region adjacent to the gate structure; and
a high temperature (HT) doped interlayer dielectric (ILD) layer disposed over the doped strained region, wherein the HT doped ILD layer comprises germanium dopants, nitrogen dopants, or a combination thereof with a non-linear doping density profile across a vertical dimension of the HT doped ILD layer.

18. The semiconductor device of claim 17, wherein the HT doped ILD layer comprises a concentration of the germanium dopants, the nitrogen dopants, or the combination thereof in a range from about $1\times10^{19}$ atoms/cm$^3$ to about $6\times10^{20}$ atoms/cm$^3$.

19. The semiconductor device of claim 17, wherein an etch property of the HT doped ILD layer is based on a concentration of the germanium dopants, nitrogen dopants, or a combination thereof.

20. The semiconductor device of claim 1, wherein the non-linear doping density of the dopant materials is in a range from about $1\times10^{19}$ atoms/cm$^3$ to about $6\times10^{20}$ atoms/cm$^3$.

* * * * *